United States Patent [19]
Oh

[11] Patent Number: 5,650,744
[45] Date of Patent: Jul. 22, 1997

[54] CHARGE NEUTRALIZING SYSTEM FOR CIRCUITS HAVING CHARGE INJECTION PROBLEMS AND METHOD THEREFOR

[75] Inventor: Sung-Hun Oh, Phoenix, Ariz.

[73] Assignee: VLSI Technology, Inc., San Jose, Calif.

[21] Appl. No.: 604,149

[22] Filed: Feb. 20, 1996

[51] Int. Cl.$^6$ ............................. G06G 7/12; H03K 17/687
[52] U.S. Cl. ......................... 327/362; 327/404; 327/437
[58] Field of Search .............................. 327/91, 94, 362, 327/170, 202, 203, 403, 404, 427, 434, 437, 574, 579

[56] References Cited

U.S. PATENT DOCUMENTS

| | | | |
|---|---|---|---|
| 4,633,222 | 12/1986 | Dingwall | 327/91 |
| 5,084,634 | 1/1992 | Gorecki | 327/91 |
| 5,250,852 | 10/1993 | Ovens et al. | 327/91 |
| 5,281,870 | 1/1994 | Kobatake | 327/170 |
| 5,384,496 | 1/1995 | Tanaka | 327/91 |

*Primary Examiner*—Toan Tran
*Attorney, Agent, or Firm*—Harry M. Weiss; Jeffrey D. Moy; Harry M. Weiss & Associates, P.C.

[57] ABSTRACT

The present invention relates to a system for neutralizing charge injection problems in a switched current system. The system is comprised of a PMOS transistor coupled in parallel with an NMOS switch transistor. If the channel area of the PMOS transistor and the NMOS transistor are equal, then the clock signal to the PMOS transistor must be adjusted to neutralize the negative channel charges of the NMOS transistor. However, if the clock signal to both the PMOS transistor and the NMOS transistor are equal, then the dimension of the PMOS transistor must be smaller than the NMOS transistor in order to neutralize the negative channel charges of the NMOS transistor.

19 Claims, 1 Drawing Sheet

CHARGE NEUTRALIZING SYSTEM FOR CIRCUITS HAVING CHARGE INJECTION PROBLEMS AND METHOD THEREFOR

BACKGROUND OF THE INVENTION

1. Field of the Invention

This invention relates to sampled data systems and, more specifically, to a charge neutralizing system for switched current systems having charge injection problems and method therefor.

2. Description of the Prior Art

Charge injection has been a major problem for switched current systems. In a switched current system, a signal is sampled by a transistor switch. The charge injection problem occurs when the transistor switch is turned off. The charge stored in the transistor switch when the transistor switch is activated has to be discharged to disconnect the transistor switch. For an NMOS transistor switch, the negative channel charge is induced when the NMOS transistor switch is activated. However, when the NMOS transistor switch is deactivated, the negative channel charge must be neutralized by a positive charge. A positive charge stored in a parasitic capacitor or a load capacitor of the drain or source of the NMOS transistor switch must be supplied in order to neutralize the negative channel charge. The neutralization of the negative channel charge by the positive charge lowers the charge stored in the drain and source nodes of the transistor switch which causes the charge injection problem.

In order to reduce the charge injection problem, a dummy transistor or a replica circuit technique have been proposed. While these two proposals do work, they produce several problems. The dummy transistor technique uses two clock phases. This in turns makes the dummy transistor technique very difficult to control since the accuracy is critically dependent on the clock phase edges. The replica circuit however, while not dependent on clock phase edges, consumes a larger amount of area. The larger use of area and power consumption makes the replica circuit technique uneconomical to use.

Therefore, a need existed to provide an improved system and method for reducing charge injection problems in a transistor switching circuit. The improved system and method will supply a charge to neutralize the channel charge stored in the transistor switch when the transistor switch is disconnected. The improved system and method will not be critically dependent on clock phase edges. The improved system and method will also not consume large amounts of power or large areas of silicon real estate thus making the system economically practical to install.

SUMMARY OF THE INVENTION

In accordance with one embodiment of the present invention, it is an object of the present invention to provide an improved system and method for reducing charge injection problems in a transistor switching circuit.

It is another object of the present invention to provide an improved system and method for reducing charge injection problems in a transistor switching circuit that will supply an opposite charge to neutralize the channel charge stored in the transistor switch when the transistor switch is deactivated.

It is still another object of the present invention to provide an improved system and method for reducing charge injection problems in a transistor switching circuit that will not be critically dependent on clock phase edges.

It is a further object of the present invention to provide an improved system and method for reducing charge injection problems in a transistor switching circuit that will not consume large areas of silicon real estate or consume large amounts of power thus making the system economically practical to install.

BRIEF DESCRIPTION OF THE PREFERRED EMBODIMENTS

In accordance with one embodiment of the present invention, a charge neutralizing system for a circuit having charge injection problems is disclosed. The system is comprised of a switching means for transmitting and stopping transmission of a signal to the circuit. Neutralizing means are coupled to the switching means for cancelling a charge stored in the switching means when the switching means stops transmitting the signal. In the preferred embodiment, the switching means and the neutralizing means are transistors wherein the switching means is an NMOS transistor and the neutralizing means is a PMOS transistor coupled to the NMOS transistor in parallel. First voltage source means are coupled to a gate of the NMOS transistor for supplying a voltage source $V_{DD}$ to activate the NMOS transistor. Second voltage source means are coupled to a gate of the PMOS transistor for supplying a voltage to neutralize the channel charge of the NMOS transistor when the first voltage source means goes low to deactivate the NMOS transistor. If the channel area of the NMOS transistor is equal to a channel area of the PMOS transistor then the second voltage source means must supply a voltage substantially equal to the equation $-V_{DD}+2V_A+V_{TN}-|V_{TP}|$ in order to neutralize the channel charge of the NMOS transistor where $V_{DD}$ is a voltage of the first voltage source means to activate the NMOS transistor, $V_A$ is the drain or source voltage of the NMOS transistor when the NMOS transistor is on, $V_{TN}$ is a threshold voltage of the NMOS transistor, and $V_{TP}$ is a threshold voltage of the PMOS transistor. If the voltage of the second voltage source means is equal in magnitude and opposite in polarity to the voltage of the first voltage source means, then the channel area of the PMOS transistor must be substantially equal to $W_N L_N((\Phi-V_A-V_{TN})/(\Phi+V_A-|V_{TP}|))$ in order to neutralize the channel charge of the NMOS transistor where $W_N$ is a channel width of the NMOS transistor, $L_N$ is a channel length of the NMOS transistor, $\Phi$ is the voltage of the first voltage source means, $V_A$ is the drain or source voltage of the NMOS transistor when the NMOS transistor is on, $V_{TN}$ is a threshold voltage of the NMOS transistor, and $V_{TP}$ is a threshold voltage of the PMOS transistor.

In accordance with another embodiment of the present invention, a method for neutralizing a switching circuit having charge injection problems is disclosed. The method comprises the steps of: providing switching means for transmitting and stopping transmission of a signal to the circuit; and providing neutralizing means coupled to the switching means for cancelling a charge stored in the switching means when the switching means stops transmitting the signal. In the preferred embodiment of the method, the switching means and the neutralizing means are transistors. The switching means is an NMOS transistor and the neutralizing means is a PMOS transistor coupled to the NMOS transistor in parallel. The method further comprises the steps of: providing first voltage source means coupled to a gate of the NMOS transistor for supplying a voltage source $V_{DD}$ to activate the NMOS transistor; and providing second voltage source means coupled to a gate of the PMOS transistor for supplying a voltage to neutralize a channel charge of the NMOS transistor when the first voltage source means goes low to deactivate the NMOS transistor. If the channel area of the NMOS transistor is equal to the channel area of the PMOS transistor then the second voltage source means must supply a voltage substantially equal to $-V_{DD}+2V_A+V_{TN}-|V_{TP}|$ in order to neutralize the channel charge of the NMOS transistor where $V_{DD}$ is a voltage of the first voltage source means to activate the NMOS transistor, $V_A$ is the drain or source voltage of the NMOS transistor when the NMOS transistor is on, $V_{TN}$ is a threshold voltage of the NMOS transistor, and $V_{TP}$ is a threshold voltage of the PMOS transistor. If the second voltage source means provides a voltage equal in magnitude and opposite in polarity to the voltage of the first voltage source means, then the channel area of the PMOS transistor must be substantially equal $W_N L_N((\Phi-V_A-V_{TN})/(\Phi+V_A-|V_{TP}|))$ in order to neutralize the channel charge of the NMOS transistor where $W_N$ is a channel width of the NMOS transistor, $L_N$ is a channel length of the NMOS transistor, $\Phi$ is the voltage of the first voltage source means, $V_A$ is the drain or source voltage of the NMOS transistor when the NMOS transistor is on, $V_{TN}$ is a threshold voltage of the NMOS transistor, and $V_{TP}$ is a threshold voltage of the PMOS transistor.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
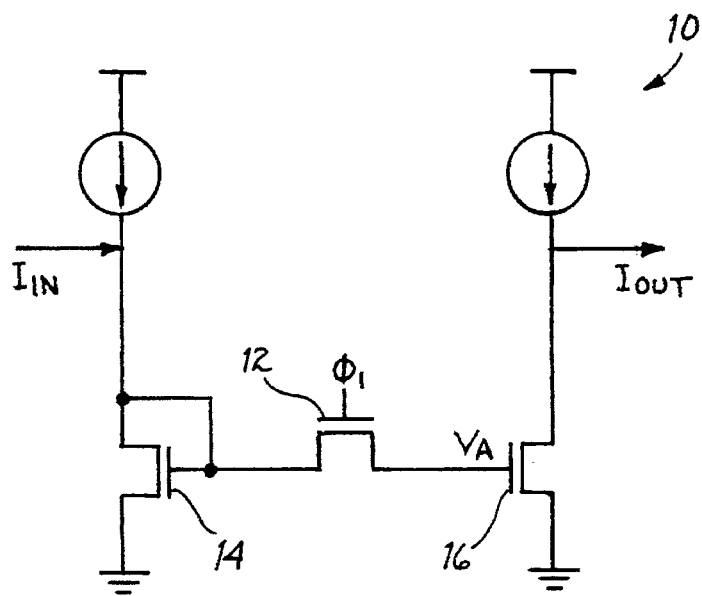
FIG. 1 is a schematic of a prior art circuit with possible charge injection problems.

Recently, switched currents have emerged as a new technique for analog sampled-data signal processing. However, charge injection problems exist with these switched current systems. Referring to FIG. 1, a prior art switched current system 10 is shown. The switched current system 10 uses a track and hold circuit as opposed to a sample and hold circuit for switched voltage systems. In the switched current system 10, an NMOS transistor 12 is used as a switch to track an input current $I_{IN}$ and copy the input current $I_{IN}$ the output current $I_{OUT}$. When an input clock signal $\Phi$ is high, the NMOS transistor 12 is turned on. When the NMOS transistor 12 is turned on, the gate voltages of the transistor 14 and the transistor 16 are equal. Ignoring secondary parasitic charges between the gate and source and the gate and drain of the NMOS transistor switch 12, the channel of the NMOS switch transistor 12 is charged to a value substantially equal to:

$$-C_{OX}W_N L_N(\Phi-V_A-V_{TN})$$

where $C_{OX}$ is the gate capacitance of the NMOS transistor 12;

$W_N$ is the channel width of the NMOS transistor 12;

$L_N$ is the channel length of the NMOS transistor 12;

$\Phi$ is the clock signal;

$V_A$ is the drain or source voltage of the transistor 12 when the transistor 12 is activated; and $V_{TN}$ is the threshold voltage of the NMOS transistor 12.

When the clock signal $\Phi$ goes low, the gate charges of the NMOS switch transistor 12 decreases and so does the magnitude of the channel charges. Therefore, the negative charges have to be neutralized by positive charges in order to prevent charge injection problems. The positive charges for neutralizing the negative channel charges may be supplied from either the gate of transistor 14 or from the gate of transistor 16. When the neutralizing positive charges are supplied from the charges stored in the gate of the transistor 16, the gate voltage of transistor 16 is lowered since:

$$\Delta Q = C \Delta V$$

where $\Delta Q$ is the change in the gate charge for transistor 16;

$C$ is the gate capacitance for transistor 16; and $\Delta V$ is the change in gate voltage for transistor 16.

However, in order for there to be no charge injection problems, there must be another positive charge supplier to neutralize the negative channel charge of the switch transistor 12 so that the gate voltage of the transistor 16 is sustained.

Figure 2:
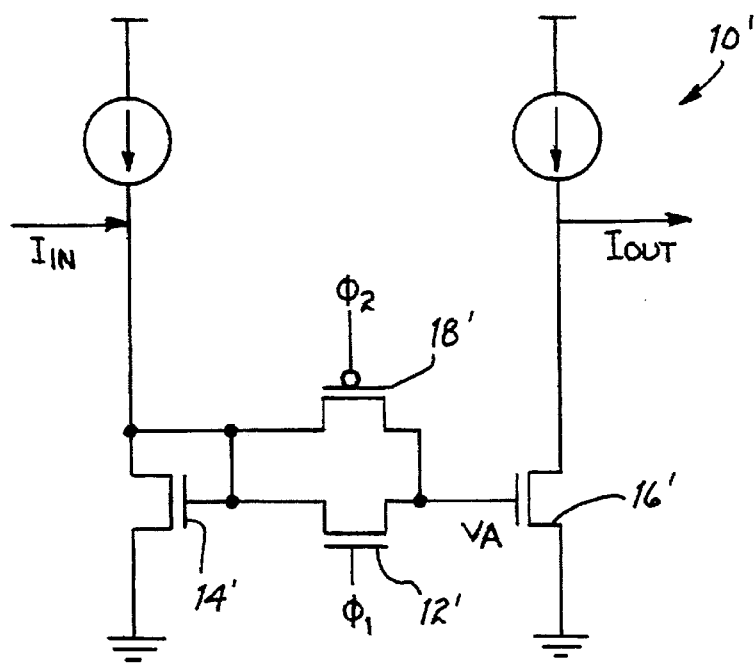
FIG. 2 is a schematic of a circuit for neutralizing charge injection problems.

Referring to FIG. 2, wherein like numerals represent the same elements as in FIG. 1 except for the use of the ' which represents a different embodiment, the same system 10' is shown. However, in this embodiment, a PMOS transistor 18' is connected in parallel to the NMOS switch transistor 12'. The purpose of the PMOS transistor 18' is different from the typical CMOS transmission gate used in switched voltage systems. In switched voltage systems, the main purpose of the CMOS transmission gate is to increase input signal swing. Thus, the CMOS transmission gate would be operating throughout all device operating regions. However, the purpose of the PMOS transistor 18' is not to increase the input signal swing, but to supply positive charges to cancel and neutralize the negative channel charges of the NMOS switch transistor 12'. Furthermore, in the present invention, the operating region of the PMOS transistor 18' is limited to the triode region.

Assuming negligible drain to source voltage across the charge neutralizing PMOS transistor 18' and ignoring second order parasitic NMOS transistor 16' gate charge terms, the channel charge of the PMOS transistor 18' can be approximately expressed by the equation:

$$-C_{OX}W_P L_P(\Phi_2-V_A+|V_{TP}|)$$

where $C_{OX}$ is the gate capacitance of the PMOS transistor 18';

$W_P$ is the channel width of the PMOS transistor 18';

$L_P$ is the channel length of the PMOS transistor 18';

$\Phi_2$ is the clock signal for the PMOS transistor 18';

$V_A$ is the drain or source voltage of the NMOS transistor 12' when the NMOS transistor 12' is activated; and $V_{TP}$ is the threshold voltage of the PMOS transistor 18'.

To neutralize the channel charges of the NMOS switch transistor 12', the sum of the total charges has to be zero. This can be represented by the equation:

$$-C_{OX}W_N L_N(\Phi_1-V_A-V_{TN})-C_{OX}W_P L_P(\Phi_2-V_A+|V_{TP}|)=0$$

or $$W_N L_N(\Phi-V_A-V_{TN})+W_P L_P(\Phi_2-V_A+|V_{TP}|)=0$$

There are two ways to solve the charge neutrality problem. If the channel area of the NMOS switch transistor 12' and the PMOS transistor 18' are equal ($W_N L_N = W_P L_P$) and the NMOS switch transistor 12' is supplied with a clock signal $\Phi_2$ which is equal to a power supply voltage $V_{DD}$, then the PMOS transistor 18' must be supplied with a clock signal $\Phi_2$ approximately equal to:

$$\Phi_2 = -V_{DD} + 2V_A + V_{TN} - |V_{TP}|$$

However, if the clock signals $\Phi_1$ and $\Phi_2$ are equal in magnitude ($\Phi_1 = |\Phi_2|$) then the channel area of the PMOS transistor 18' must be approximately equal to:

$$W_P L_P = W_N L_N ((\Phi_1 - V_A - V_{TN})/(\Phi_1 + V_A - |V_{TP}|))$$

Thus, the dimension of the PMOS transistor 18' will be smaller than that of the NMOS switch transistor 12'.

As stated above, the voltage $V_A$ is equal to the drain voltage or the source voltage of the NMOS transistor switch 12' when the NMOS transistor switch 12' is activated. This is due to the fact that when the NMOS transistor switch 12' is activated, the source voltage and the drain voltage of the NMOS transistor switch 12' are equal.

While the invention has been particularly shown and described with reference to preferred embodiments thereof, it will be understood by those skilled in the art that the foregoing and other changes in form and details may be made therein without departing from the spirit and scope of the invention.

I claim:

1. A charge neutralizing system for a circuit having charge injection problems comprising, in combination:

switching means for transmitting and stopping transmission of a signal to said circuit; and neutralizing means coupled to said switching means for cancelling a charge stored in said switching means when said switching means stops transmitting said signal.

2. A charge neutralizing system in accordance with claim 1 wherein said switching means and said neutralizing means are transistors.

3. A charge neutralizing system in accordance with claim 1 wherein said switching means is an NMOS transistor.

4. A charge neutralizing system in accordance with claim 3 wherein said neutralizing means is a PMOS transistor.

5. A charge neutralizing system in accordance with claim 4 wherein said PMOS transistor is coupled to said NMOS transistor in parallel.

6. A charge neutralizing system in accordance with claim 5 wherein a channel area of said NMOS transistor is equal to a channel area of said PMOS transistor.

7. A charge neutralizing system in accordance with claim 6 further comprising:

first voltage source means coupled to a gate of said NMOS transistor for supplying a voltage source $V_{DD}$ to activate said NMOS transistor; and second voltage source means coupled to a gate of said PMOS transistor for supplying a voltage to neutralize a channel charge of said NMOS transistor when said first voltage source means goes low to deactivate said NMOS transistor.

8. A charge neutralizing system in accordance with claim 7 wherein said second voltage source means supplies a voltage substantially equal to $-V_{DD} + 2V_A + V_{TN} - |V_{TP}|$ where $V_{DD}$ is a voltage of said first voltage source means to activate said NMOS transistor, $V_A$ is a voltage selected from the group consisting of a source voltage and a drain voltage of said NMOS transistor when said NMOS transistor is activated, $V_{TN}$ is a threshold voltage of said NMOS transistor, and $V_{TP}$ is a threshold voltage of said PMOS transistor.

9. A charge neutralizing system in accordance with claim 5 further comprising:

first voltage source means coupled to a gate of said NMOS transistor for supplying a voltage to activate said NMOS transistor; and second voltage source means coupled to a gate of said PMOS transistor for supplying a voltage to neutralize a channel charge of said NMOS transistor when said first voltage source means goes low to deactivate said NMOS transistor.

10. A charge neutralizing system in accordance with claim 9 wherein said voltage of said second voltage source means is equal in magnitude and opposite in polarity to said voltage of said first voltage source means.

11. A charge neutralizing system in accordance with claim 10 wherein said PMOS transistor has a channel area substantially equal to $W_N L_N((\Phi - V_A - V_{TN})/(\Phi + V_A - |V_{TP}|))$ where $W_N$ is a channel width of said NMOS transistor, $L_N$ is a channel length of said NMOS transistor, $\Phi$ is said voltage of said first voltage source means, $V_A$ is a voltage selected from the group consisting of a source voltage and a drain voltage of said NMOS transistor when said NMOS transistor is activated, $V_{TN}$ is a threshold voltage of said NMOS transistor, and $V_{TP}$ is a threshold voltage of said PMOS transistor.

12. A method for neutralizing a switching circuit having charge injection problems comprising the steps of:

providing switching means for transmitting and stopping transmission of a signal to said circuit; and providing neutralizing means coupled to said switching means for cancelling a charge stored in said switching means when said switching means stops transmitting said signal.

13. The method of claim 12 wherein said switching means and said neutralizing means are transistors.

14. The method of claim 12 wherein said step of providing switching means further comprises the step of providing an NMOS transistor as said switching means.

15. The method of claim 14 wherein said step of providing neutralizing means further comprises the step of providing a PMOS transistor as said neutralizing means.

16. The method of claim 15 wherein said step of providing a PMOS transistor further comprises the step of coupling said PMOS transistor to said NMOS transistor in parallel.

17. The method of claim 16 further comprising the steps of:

providing a channel area of said NMOS transistor equal to a channel area of said PMOS transistor;

providing first voltage source means coupled to a gate of said NMOS transistor for supplying a voltage source $V_{DD}$ to activate said NMOS transistor; and providing second voltage source means coupled to a gate of said PMOS transistor for supplying a voltage to neutralize a channel charge of said NMOS transistor when said first voltage source means goes low to deactivate said NMOS transistor.

18. The method of claim 17 wherein said step of providing second voltage source means further comprises the step of providing second voltage source means which supplies a voltage substantially equal to $-V_{DD} + 2V_A + V_{TN} - |V_{TP}|$ where VDD is a voltage of$V_{DD}$ is a voltage of said first voltage source means to activate said NMOS transistor, $V_A$ is a voltage selected from the group consisting of a source voltage and a drain voltage of said NMOS transistor when said NMOS transistor is activated, $V_{TN}$ is a threshold voltage of said NMOS transistor, and $V_{TP}$ is a threshold voltage of said PMOS transistor.

19. The method of claim 16 further comprising the steps of:

providing first voltage source means coupled to a gate of said NMOS transistor for supplying a voltage to activate said NMOS transistor;

providing second voltage source means coupled to a gate of said PMOS transistor for supplying a voltage to neutralize a channel charge of said NMOS transistor when said first voltage source means goes low to deactivate said NMOS transistor, said voltage of said second voltage source means being equal in magnitude and opposite in polarity to said voltage of said first voltage source means; and providing said PMOS transistor having a channel area substantially equal to $W_N L_N((\Phi-V_A-V_{TN})/(\Phi+V_A-|V_{TP}|))$ where $W_N$ is a channel width of said NMOS transistor, $L_N$ is a channel length of said NMOS transistor, $\Phi$ is said voltage of said first voltage source means, $V_A$ is a voltage selected from the group consisting of a source voltage and a drain voltage of said NMOS transistor when said NMOS transistor is activated, $V_{TN}$ is a threshold voltage of said NMOS transistor, and $V_{TP}$ is a threshold voltage of said PMOS transistor.

* * * * *